United States Patent
Woltman et al.

(10) Patent No.: US 9,167,217 B2
(45) Date of Patent: Oct. 20, 2015

(54) HIGH EFFICIENCY LASER MODULATION

(71) Applicant: Microvision, Inc., Redmond, WA (US)

(72) Inventors: Scott Woltman, Lynnwood, WA (US); Robert James Jackson, Monroe, WA (US); Christopher Brian Adkins, Redmond, WA (US)

(73) Assignee: Microvision, Inc., Redmond, WA (US)

( * ) Notice: Subject to any disclaimer, the term of this patent is extended or adjusted under 35 U.S.C. 154(b) by 440 days.

(21) Appl. No.: 13/875,821

(22) Filed: May 2, 2013

(65) Prior Publication Data

US 2014/0327835 A1 Nov. 6, 2014

(51) Int. Cl.
G03B 21/00 (2006.01)
H04N 9/31 (2006.01)

(52) U.S. Cl.
CPC .................................. H04N 9/3135 (2013.01)

(58) Field of Classification Search
CPC ........... G02B 26/10; H04N 5/74; G03B 21/14
See application file for complete search history.

(56) References Cited

U.S. PATENT DOCUMENTS

| | | |
|---|---|---|
| 2004/0119004 A1 | 6/2004 | Wine et al. |
| 2005/0024704 A1 | 2/2005 | Sakai |
| 2010/0182668 A1 | 7/2010 | Abe et al. |
| 2010/0283413 A1* | 11/2010 | Richter ................ H04N 9/3129 315/360 |
| 2013/0050156 A1 | 2/2013 | Rothaar |

FOREIGN PATENT DOCUMENTS

JP 2009075508 4/2009

OTHER PUBLICATIONS

Microvision, Inc., , "International Search Report and Written Opinion", ISR and Written Opinion for PCT/US2014/032536, Aug. 8, 2014.

* cited by examiner

*Primary Examiner* — Sultan Chowdhury
*Assistant Examiner* — Danell L Owens
(74) *Attorney, Agent, or Firm* — Kevin D. Wills

(57) ABSTRACT

A scanning laser projector drives laser light sources with waveforms for higher efficiency. Optical light power values for pixels are mapped to amplitude/duration pairs. Laser diodes are driven with electrical currents having the amplitude for time period specified by the duration. For increasing optical light power values, amplitude values are increased, and then durations are increased.

20 Claims, 13 Drawing Sheets

HIGH EFFICIENCY LASER MODULATION

FIELD

The present invention relates generally to scanning projectors, and more specifically to light modulation in scanning projectors.

BACKGROUND

In scanned beam projection systems, pixels are typically generated by modulating light from laser light sources as a scanning mirror scans the modulated light in a raster pattern. The efficiency of the laser light sources depends on many factors. For example, efficiency may be a function of wavelength, modulation frequency, threshold current, laser diode voltage, and laser optical power.

DESCRIPTION OF EMBODIMENTS

Figure 1:
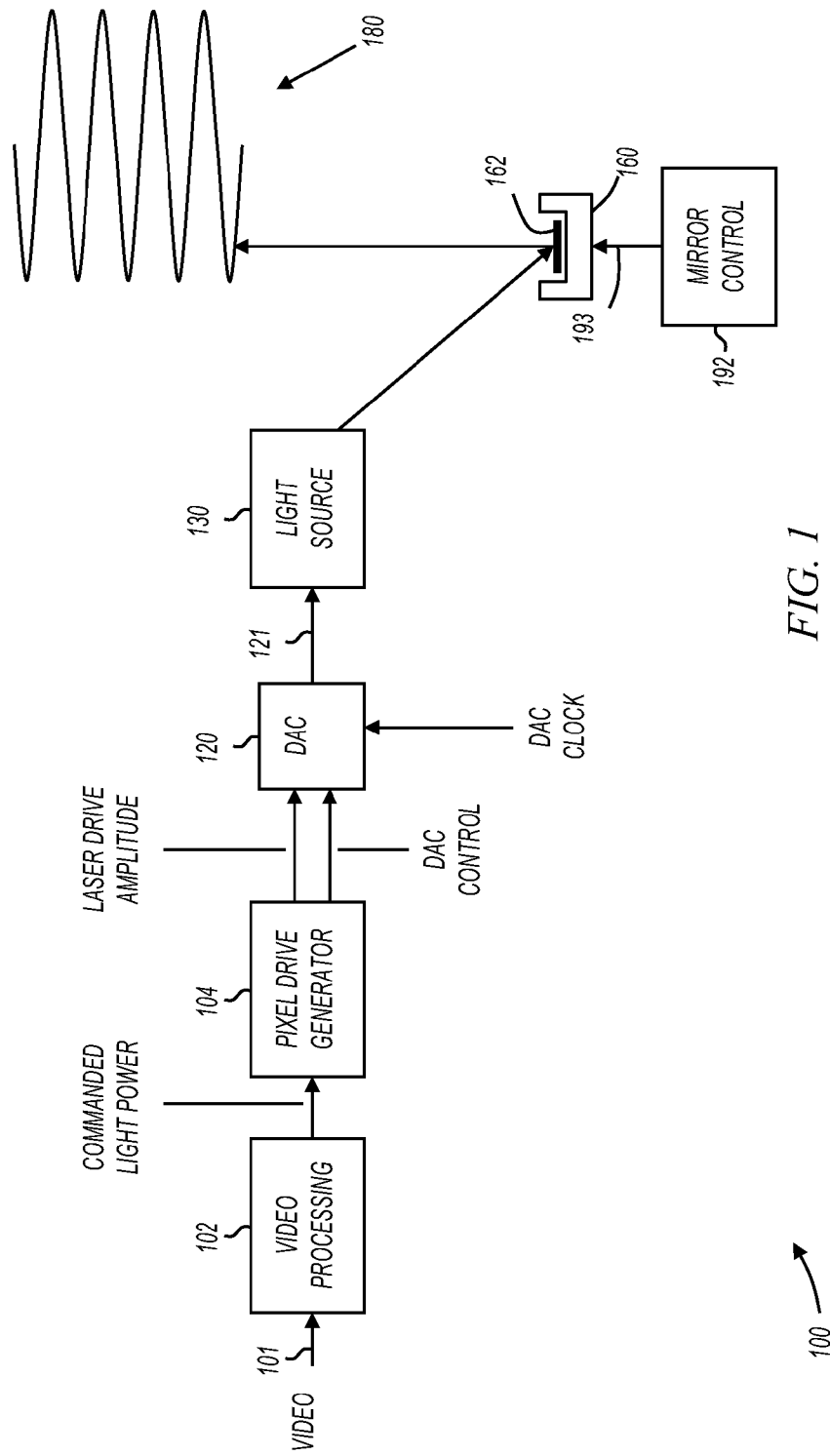
FIG. 1 shows a scanning projector with a pixel drive generator in accordance with various embodiments of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a scanning projector with a pixel drive generator in accordance with various embodiments of the present invention. Projector 100 includes video processing component 102, pixel drive generator component 104, digital-to-analog converter (DAC) 120, light source 130, microelectromechanical machine (MEMS) device 160 having scanning mirror 162, and mirror control circuit 192.

In operation, video processing component 102 receives video data on node 101 and produces display pixel data representing commanded light power values of pixels that are to be displayed. The video data 101 represents image source data that is typically received with pixel data on a rectilinear grid, but this is not essential. For example, video data 101 may represent a grid of pixels at any resolution (e.g., 640×480, 848×480, 1280×720, 1920×1080). The input light intensity encoding typically represents the light intensity in 8, 10, 12 bit or higher resolutions.

Projection apparatus 100 is a scanning projector that scans a raster pattern. The raster pattern does not necessarily align with the rectilinear grid in the image source data, and video processing component 102 operates to produce display pixel data that will be displayed at appropriate points on the raster pattern. For example, in some embodiments, video processing component 102 interpolates vertically and/or horizontally between pixels in the source image data to determine display pixel values along the scan trajectory of the raster pattern.

Video processing component 102 may include any circuitry capable of performing the functions described. For example, in some embodiments, video processing component 102 includes digital circuits capable of performing interpolation such as multipliers, shifters, and adders. Also for example, in some embodiments, video processing component 102 may include hardware circuits and may also include a processor that executes instructions.

Pixel drive generator component 104 receives commanded light power values from video processing component 102, and maps the commanded light power values to digital drive values and DAC control values which control both amplitude and duration of resulting light pulses used to produce display pixels. In some embodiments, pixel drive generator component 104 includes a look-up table that maps light power values to digital drive values and DAC control values. Further, in some embodiments, pixel drive generator component 104 includes circuitry to generate DAC control signals based on the commanded luminance as well as other control variables. Example control variables include, but are not limited to, temperature, laser diode rise and fall times, color, current horizontal scan region, scan direction, video frame, video line, and the like.

Pixel drive generator component 104 may include any circuitry capable of performing the functions described. For example, in some embodiments, pixel drive generator component 104 includes digital circuits capable of transforming the commanded light power values into amplitude/duration pairs, such as multipliers, shifters, adders, and look-up tables implemented with memory devices. Also for example, in some embodiments, pixel drive generator component 104 may include hardware circuits and may also include a processor that executes instructions.

Digital-to-analog converter (DAC) 120 converts digital laser drive amplitude values to analog currents. DAC 120 receives a DAC clock, laser drive amplitude values, and DAC control signals. The DAC clock may be sourced by any suitable circuit, such as a phase locked loop (PLL), and may be a fixed frequency clock or a variable frequency clock. The term "fixed frequency" is used herein to describe a clock signal that has a frequency that may vary slightly based on many factors, including but not limited to PLL variations, oscillator phase noise, mechanical vibrations, and the like. The period of the DAC clock is referred to herein as the "DAC clock period." For fixed frequency DAC clocks, the DAC clock period is substantially fixed, and for variable frequency DAC clocks, the DAC clock period varies inversely with frequency.

In some embodiments, the DAC control signals received from pixel drive generator 104 include one or more signals to control the duration of the resulting laser drive signal produced by DAC 120. For example, pixel drive generator 104 may provide a return-to-zero (RTZ) signal to DAC 120 to allow for laser drive times that are less than the DAC clock period. The RTZ signal may also provide for fine control of the horizontal spatial position of display pixels. This behavior is implemented as a Return-To-Zero (RTZ) function in commercially available laser driver DACs. One example is the ISL 58315 from Intersil Corporation of Milpitas, Calif.

Light source 130 receives drive current signals from DAC 120 and produces light having grayscale values in response thereto. Light source 130 may be monochrome or may include multiple different color light sources. For example, in some embodiments, light source 130 includes red, green, and blue light sources. In these embodiments, video processing component 102 outputs display pixel data corresponding to each of the red, green, and blue light sources. Also for example, light produced by light source 130 may be visible or nonvisible. For example, in some embodiments, one or more sources of light within light source 130 may produce infrared (IR) light. In some embodiments, light source 130 may include one or more laser light producing devices. For example, in some embodiments, light source 130 may include laser diodes.

The light from light source 130 is directed to scanning mirror 162. In some embodiments, additional optical elements are included in the light path between light source 130 and scanning mirror 162. For example, projector 100 may include collimating lenses, dichroic mirrors, or any other suitable optical elements.

Scanning mirror 162 deflects on two axes in response to electrical stimuli received on node 193 from mirror control circuits 192. While moving on the two axes, scanning mirror 162 reflects modulated light provided by light source 130. The reflected light sweeps a raster pattern and creates a resultant display in an image plane at 180. The shape of the raster pattern swept by scanning mirror 162 is a function of the mirror movement on its two axes. For example, in some embodiments, scanning mirror 162 sweeps on a first axis (e.g., vertical dimension) in response to sawtooth wave stimulus, resulting in a substantially linear and unidirectional vertical sweep. Also for example, in some embodiments, scanning mirror 162 sweeps on a second axis (e.g., horizontal dimension) according to a sinusoidal stimulus, resulting in a substantially sinusoidal horizontal sweep.

MEMS device 160 is an example of a scanning mirror assembly that scans light in two dimensions. In some embodiments the scanning mirror assembly includes a single mirror that scans in two dimensions (e.g., on two axes). Alternatively, in some embodiments, MEMS device 160 may be an assembly that includes two scan mirrors, one which deflects the beam along one axis, and another which deflects the beam along a second axis largely perpendicular to the first axis.

In some embodiments, light sources 130 are operated at a fixed voltage. For example, a laser diode may have a fixed operating voltage (e.g., 8 volts) constantly applied, and the current through the laser diode is modulated to produce light. In general, a laser diode will exhibit a peak efficiency operating point when the current reaches its highest drive amplitude for a given operating voltage. That current value is referred to herein as the "peak efficiency amplitude."

In some embodiments, drive current amplitude/duration pairs are selected for each commanded light power value so as to operate with high efficiency. For example, shorter durations are selected when possible to increase the amplitude closer to the peak efficiency amplitude. As commanded light powers increase, pulse durations are increased incrementally while maintaining the current amplitude as close as possible to the peak efficiency amplitude. In some embodiments, the duration is measured in DAC clock periods, fractional DAC clock periods, or periods of a higher frequency clock signal.

Amplitude/duration pair selection may also be influenced by input information (control variables) such as temperature, laser characteristics, color, frame count, and projection region. Based on these inputs and others, pixel drive generator component 104 determines the correct amplitude/duration output to achieve a monotonic input code to light intensity output relationship. Temperature information allows for compensation of laser output variation as a function of temperature. Accounting for laser light source characteristics such as rise and fall times allow for correct adjustments of amplitude/duration to achieve high resolution. Frame count can allow for alternating overlap of discrete duration transitions that reduce perception of discrete duration transition artifacts. Line count (similar to frame count) allows for a pseudo-random dithering of the exact horizontal position (spatial pixel) of the transition amplitude step. This aids in reducing any perceived image artifacts that may occur due to non-ideal laser drive components.

Figure 2:
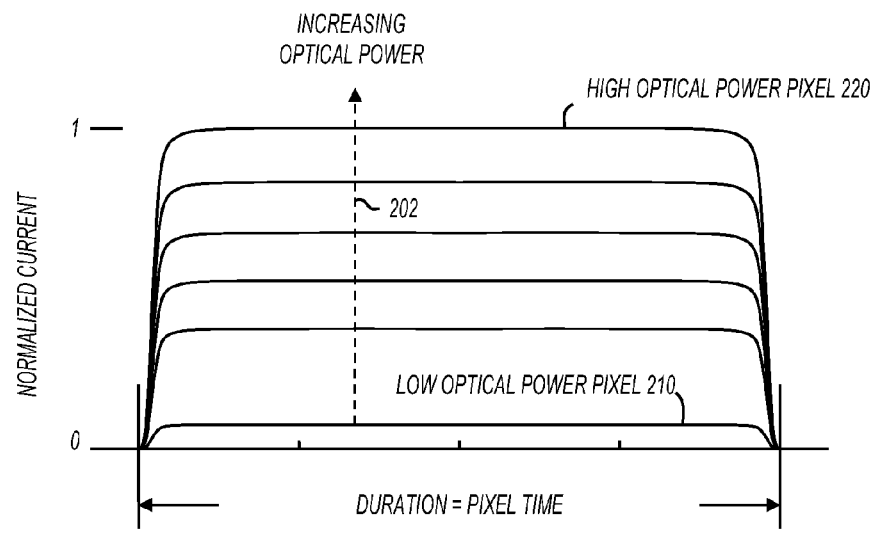
FIG. 2 shows current waveforms for various optical powers over a pixel time in accordance with various embodiments of the present invention.

FIG. 2 shows current waveforms for various optical powers over a pixel time in accordance with various embodiments of the present invention. The horizontal axis represents time and the vertical axis represents electrical current sourced from DAC 120 to light source 130. Each of the waveforms represents an amplitude and a duration of an electrical current, which in turn also represents an amplitude and duration of light emitted by the light source. The amplitude of the electrical current sets the instantaneous light output from the light source, and the amplitude times the duration sets the total light power that is output for a given pixel.

In embodiments represented by FIG. 2, the duration of each pulse is set to the entire pixel time. As used herein, the term "pixel time" refers to the amount of time the light beam is traversing a spatial pixel. In some embodiments, pixel times are uniform across the raster pattern, and in other embodiments, pixel times are not uniform. Waveform 210 represents a low optical power pixel. The amplitude of the electrical current is relatively low for the duration of the pulse. Waveform 220 represents a high optical power pixel. The amplitude of the electrical current is at or near a maximum value for the duration of the pulse. Arrow 220 shows that the amplitude increases for pixel having increasing optical power.

Figure 3:
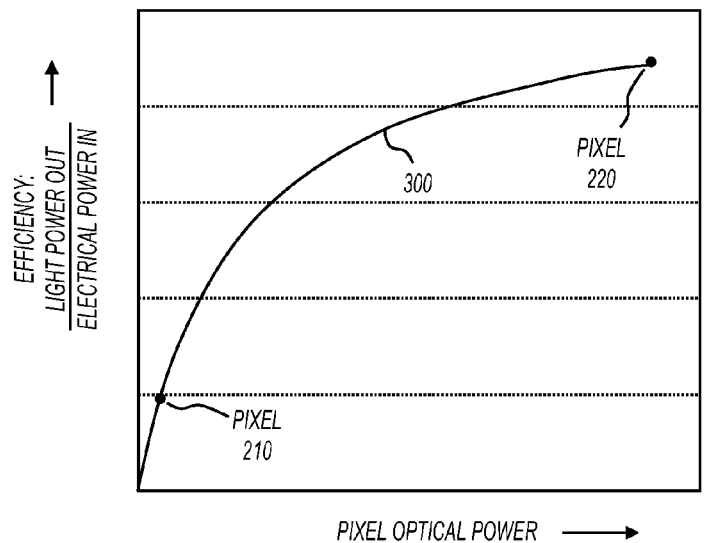
FIG. 3 shows a plot of efficiency as a function of pixel optical power for the waveforms of FIG. 2 in accordance with various embodiments of the present invention.

FIG. 3 shows a plot of efficiency as a function of pixel optical power for the waveforms of FIG. 2 in accordance with various embodiments of the present invention. Plot 300 shows the relative efficiency of pixels of various optical powers, where efficiency is defined as light power out divided by electrical power in. Low optical power pixel 210 has a relatively low efficiency, and high optical power pulse 220 has a relatively high efficiency.

In some embodiments, projection apparatus 100 (FIG. 1) operates continuously at low pixel optical powers. For example, video content may include mostly low power pixel content with only an occasional bright pixel. In these embodiments, generating pixels with waveforms as shown in FIG. 2 may result in lower overall efficiency.

It is instructive to note that the highest efficiency occurs at the highest instantaneous output power. This is due to many factors, including fixed voltages typically imposed on laser diodes, and fixed threshold currents that must be overcome before any light is created. The amplitude of the electrical current for high optical power pixel 220 is referred to herein as the "peak efficiency amplitude."

Figure 4:
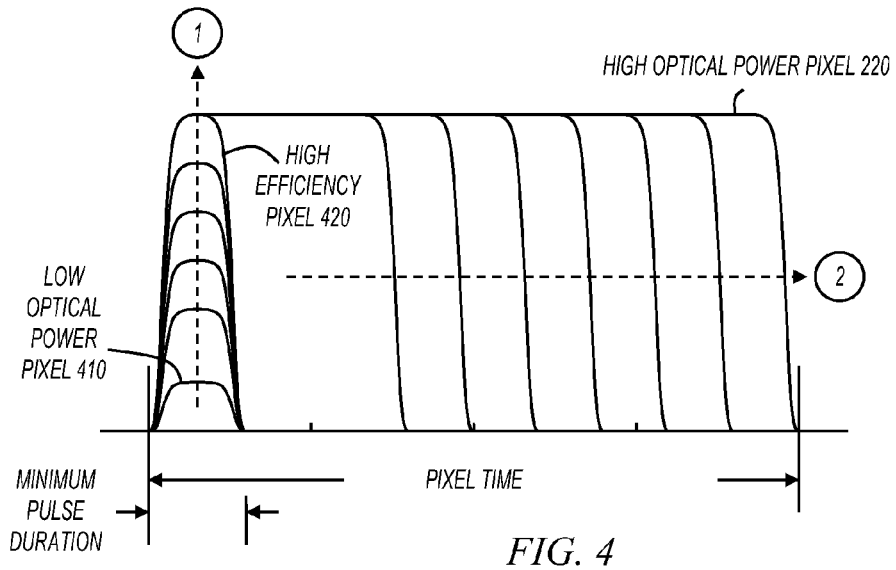
FIG. 4 shows increasing current amplitude for a minimum pulse duration, and then increasing duration thereafter in accordance with various embodiments of the present invention.

FIG. 4 shows increasing current amplitude for a minimum pulse duration, and then increasing duration thereafter in accordance with various embodiments of the present invention. The horizontal axis represents time and the vertical axis represents electrical current sourced from DAC 120 to light source 130. Each of the waveforms represents an amplitude and a duration of an electrical current, which in turn also represents an amplitude and duration of light emitted by the light source. The amplitude of the electrical current sets the instantaneous light output from the light source, and the amplitude times the duration sets the total light power that is output for a given pixel.

The lowest optical power pixel shown in FIG. 4 is at 410, and the highest optical power pixel is shown at 220. Pixel 420 is at an intermediate, yet high efficiency, optical power. As shown in FIG. 4, low optical power pixels begin with a duration that is less than the entire pixel time. In some embodiments, the duration of the lowest optical power pixels is set to a minimum pulse duration. The minimum pulse duration may be determined using any criteria. For example, the minimum pulse duration may be set equal to the period of a high speed clock. In these embodiments, the minimum pulse duration may be made smaller by sourcing a higher frequency clock. Also for example, the minimum duration may be dictated by rise and fall times of the laser light source and the driving electronics. In these embodiments, the minimum pulse duration may be made smaller as advances in electronics and light sources yield higher bandwidth circuits.

As pixels increase in optical power from the lowest power pixels, the amplitude is increased while maintaining the minimum pulse duration. This is shown by the arrow labeled with the encircled sequence number "1." The amplitude is increased for successively brighter pixels until the amplitude reaches the peak efficiency amplitude. This is shown at high efficiency pixel 420. Once the amplitude has reached the peak efficiency amplitude, increasing optical power pixels are achieved by continuously increasing the duration while maintaining the amplitude at the peak efficiency amplitude. This is shown by the arrow labeled with the encircled sequence number "2."

In some embodiments, the duration is increased monotonically with steps small enough so that every grayscale value can be represented without decreasing the electrical current below the peak efficiency amplitude. In other embodiments, the duration is increased in step sizes large enough such that the electrical current is modulated below the peak efficiency amplitude for successive duration values in order to represent all grayscale values. Various examples of duration step sizes are described below with reference to later figures.

In some embodiments, DAC 120 (FIG. 1) drives light sources 130 with waveforms shown in FIG. 4 to modulate a light beam that creates pixels having various grayscale values. Pixel drive generator 104 receives data representing a commanded light power for a given pixel, and then determines the amplitude/duration pair in accordance with the waveforms in FIG. 4 to modulate the light beam.

Figure 5:
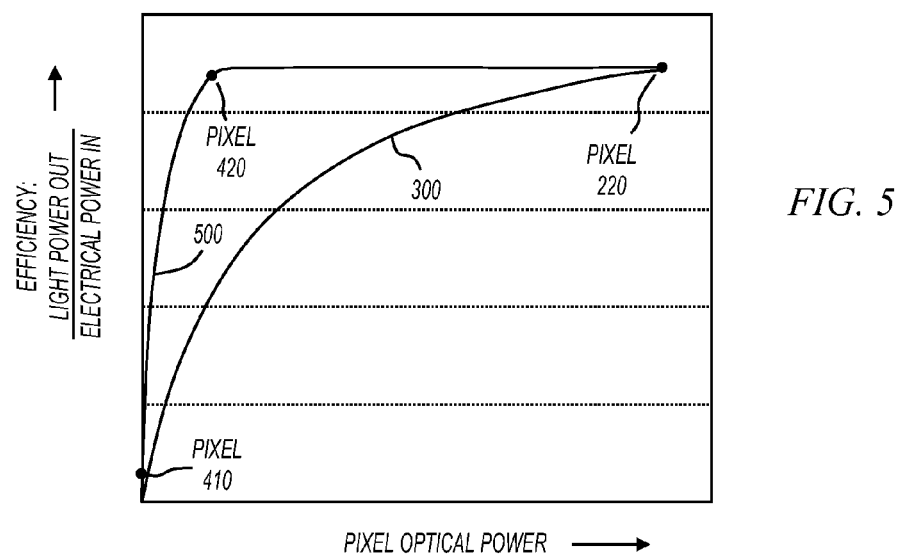
FIG. 5 shows a plot of efficiency as a function of pixel optical power for the waveforms of FIG. 4 in accordance with various embodiments of the present invention.

FIG. 5 shows a plot of efficiency as a function of pixel optical power for the waveforms of FIG. 4 in accordance with various embodiments of the present invention. Plot 500 shows the relative efficiency of pixels of various optical powers, where efficiency is defined as light power out divided by electrical power in. Low optical power pixel 410 has a relatively low efficiency, and pixel 420 has a relatively high efficiency. Note also that high optical power pulse 220 has a relatively high efficiency.

Plot 500 achieves higher efficiency for lower optical power pixels than does plot 300. Using a minimum pulse duration until the amplitude reaches the peak efficiency amplitude, and increasing the duration thereafter significantly increases efficiency for lower optical power pixels. In embodiments that operate continuously at lower output values, the modulation scheme shown in FIG. 4 is significantly more efficient than the modulation scheme shown in FIG. 2.

Figure 6:
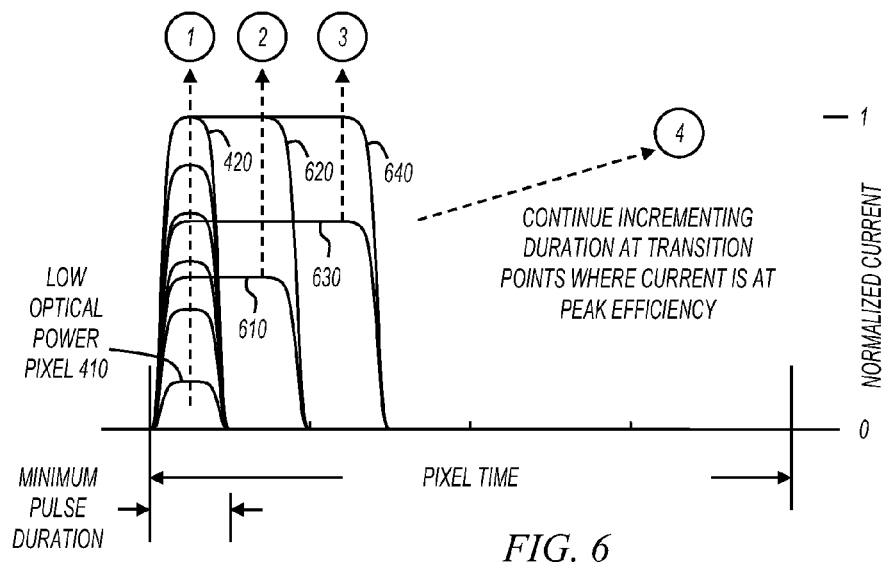
FIG. 6 shows increasing current amplitude for each of a series of uniformly incrementing pulse durations in accordance with various embodiments of the present invention.

FIG. 6 shows increasing current amplitude for each of a series of uniformly incrementing pulse durations in accordance with various embodiments of the present invention. The horizontal axis represents time and the vertical axis represents electrical current sourced from DAC 120 to light source 130. Each of the waveforms represents an amplitude and a duration of an electrical current, which in turn also represents an amplitude and duration of light emitted by the light source. The amplitude of the electrical current sets the instantaneous light output from the light source, and the amplitude times the duration sets the total light power that is output for a given pixel.

The lowest optical power pixel shown in FIG. 4 is at 410, and the highest optical power pixel is shown at 220. Pixels 420, 620, and 640 are at intermediate, yet high efficiency, optical powers. Pixels 610 and 630 are at intermediate optical powers, and are also at intermediate efficiency levels. As shown in FIG. 6, low optical power pixels begin with a duration that is less than the entire pixel time. In some embodiments, the duration of the lowest optical power pixels is set to a minimum pulse duration. Minimum pulse duration is described above with reference to FIG. 4.

As pixels increase in optical power from the lowest power pixels, the amplitude is increased while maintaining the minimum pulse duration. This is shown by the arrow labeled with the encircled sequence number "1." The amplitude is increased for successively brighter pixels until the amplitude reaches the peak efficiency amplitude. This is shown at high efficiency pixel 420. Once the amplitude has reached the peak efficiency amplitude, increasing optical power pixels are achieved by incrementally increasing the duration in uniform steps. Each time the duration is increased a step, the amplitude is dropped such that the product of the amplitude and duration monotonically increases for increasing optical power pixels.

In order of increasing optical powers, pixels start at 410 with a minimum duration and small amplitude. Amplitude is increased until it reaches the peak efficiency amplitude. This is shown by encircled.sequence number "1." Pixel 610 is the next higher grayscale pixel above 420. The duration has been doubled and the amplitude has been halved when transition between pixels 420 and 610. In some embodiments, the changes in amplitude and duration are not exactly a factor of two. Circuit and diode behavior artifacts may require that factors other 2 be used in order to achieve a monotonic light power increase when transitioning from pixel 420 to pixel 610. For increasing optical power pixels beyond pixel 610, the duration is kept constant at the second duration step while the amplitude is once again increases until the peak efficiency amplitude is reached. This is shown encircled sequence number "2," where pixel 620 is a high efficiency pixel operating at the peak efficiency amplitude. Pixel 630 is the next higher grayscale pixel above pixel 620. The duration is modified by (3/2), and the amplitude is modified by (2/3). These factors may be adjusted slightly in order to maintain a monotonic increase in pixel brightness when the duration is stepped. Once again, the amplitude is increased for increasing optical power pixels until the peak efficiency amplitude is reached. This is shown at encircled sequence number "3." This pattern of duration incrementing is continued until all optical pixel powers are represented. See encircled sequence number "4."

In some embodiments the duration is expressed as a percentage of the entire pixel time, or "duty cycle." For example, FIG. 6 shows eight different durations in steps of 12.5% of the entire pixel time. "Transition points" may be defined at commanded light power values at which the commanded light power value equals the peak efficiency amplitude times the percent of the entire pixel time. For example, for FIG. 4, transition points exist at the commanded light power values equal to the peak efficiency amplitude times (12.5%, 25%, 37.5%, . . . 87.5%).

In some embodiments, DAC 120 (FIG. 1) drives light sources 130 with waveforms shown in FIG. 6 to modulate a light beam that creates pixels having various grayscale values. Pixel drive generator 104 receives data representing a commanded light power for a given pixel, and then determines the amplitude/duration pair in accordance with the waveforms in FIG. 6 to modulate the light beam.

Figure 7:
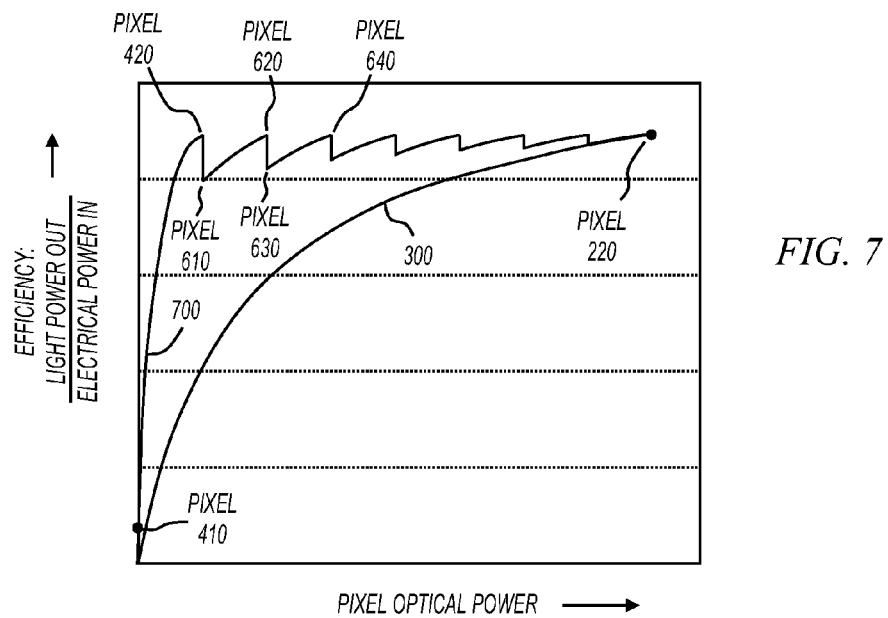
FIG. 7 shows a plot of efficiency as a function of pixel optical power for the waveforms of FIG. 6 in accordance with various embodiments of the present invention.

FIG. 7 shows a plot of efficiency as a function of pixel optical power for the waveforms of FIG. 6 in accordance with various embodiments of the present invention. Plot 700 shows the relative efficiency of pixels of various optical powers, where efficiency is defined as light power out divided by electrical power in. Low optical power pixel 410 has a relatively low efficiency, and pixel 420 has a relatively high efficiency. Note also that pixels 620, 640, and 220 have relatively high efficiencies.

Plot 700 achieves higher efficiency for lower optical power pixels than does plot 300; however, plot 700 does not achieve average efficiencies as high as plot 500 (FIG. 5). Incrementing the duration in uniform steps while keeping the amplitude as close as possible to the peak efficiency amplitude increases the average efficiency for lower optical power pixels, as compared to the modulation scheme shown in FIG. 2. In embodiments that operate continuously at lower output values, the modulation scheme shown in FIG. 6 is significantly more efficient than the modulation scheme shown in FIG. 2.

Figure 8:
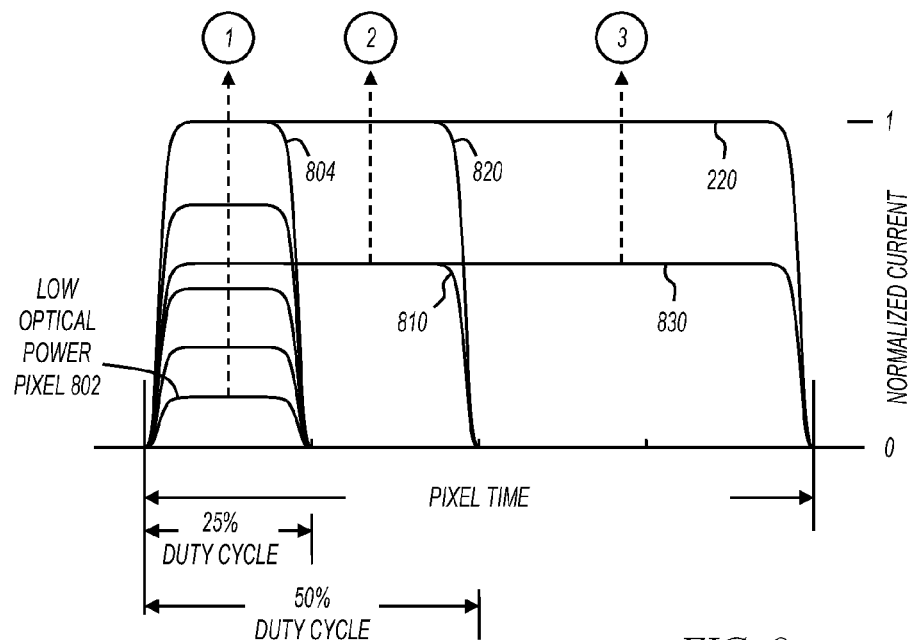
FIG. 8 shows increasing current amplitude for each of a series of non-uniformly incrementing pulse durations in accordance with various embodiments of the present invention.

FIG. 8 shows increasing current amplitude for each of a series of nonuniformly incrementing pulse durations in accordance with various embodiments of the present invention. The waveforms shown in FIG. 8 are similar to those shown in FIG. 6, above, with the exception that the duration increments are not uniform. In the example of FIG. 8, the duration values are 25%, 50%, and 100% of a pixel time.

In order of increasing optical powers, pixels start at 802 with a minimum duration and small amplitude. Amplitude is increased until it reaches the peak efficiency amplitude at pixel 804. This is shown by encircled.sequence number "1." Pixel 810 is the next higher grayscale pixel above 804. The duration has been doubled and the amplitude has been halved when transition between pixels 804 and 810. In some embodiments, the changes in amplitude and duration are not exactly a factor of two. Circuit and diode behavior artifacts may require that factors other 2 be used in order to achieve a monotonic light power increase when transitioning from pixel 804 to pixel 810. For increasing optical power pixels beyond pixel 810, the duration is kept constant at the second duration step while the amplitude is once again increases until the peak efficiency amplitude is reached. This is shown encircled sequence number "2," where pixel 820 is a high efficiency pixel operating at the peak efficiency amplitude. Pixel 830 is the next higher grayscale pixel above pixel 820. The duration has been doubled and the amplitude has been halved when transition between pixels 820 and 830. As described above, the changes in amplitude and duration may not be exactly a factor of two. For increasing optical power pixels beyond pixel 830, the duration is kept constant at the third duration step while the amplitude is once again increases until the peak efficiency amplitude is reached. This is shown encircled sequence number "3," where pixel 220 is a high efficiency pixel operating at the peak efficiency amplitude.

In some embodiments, DAC 120 (FIG. 1) drives light sources 130 with waveforms shown in FIG. 8 to modulate a light beam that creates pixels having various grayscale values. Pixel drive generator 104 receives data representing a commanded light power for a given pixel, and then determines the amplitude/duration pair in accordance with the waveforms in FIG. 8 to modulate the light beam. In some embodiments, DAC 120 includes RTZ functions that provide "off-the-shelf" duration management as shown in FIG. 8. For example, a commercially available laser driver integrated circuit that includes a DAC may provide the ability to drive a laser diode for fractional periods (e.g., 25%, 50%) of a DAC clock.

Figure 9:
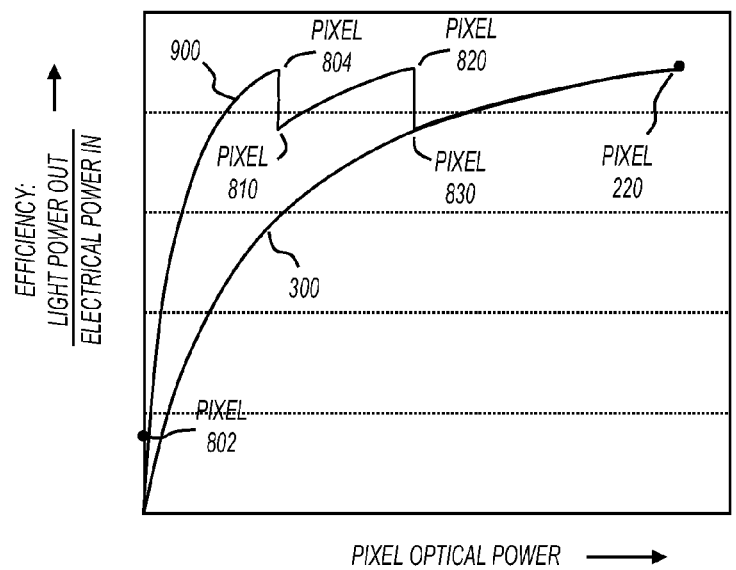
FIG. 9 shows a plot of efficiency as a function of pixel optical power for the waveforms of FIG. 8 in accordance with various embodiments of the present invention.

FIG. 9 shows a plot of efficiency as a function of pixel optical power for the waveforms of FIG. 8 in accordance with various embodiments of the present invention. Plot 900 shows the relative efficiency of pixels of various optical powers, where efficiency is defined as light power out divided by electrical power in. Low optical power pixel 802 has a relatively low efficiency, and pixel 804 has a relatively high efficiency. Note also that pixels 820 and 220 have relatively high efficiencies.

Plot 900 achieves higher efficiency for lower optical power pixels than does plot 300; however, plot 900 does not achieve average efficiencies as high as plots 500 (FIG. 5) or 700 (FIG. 7). Incrementing the duration in non-uniform steps while keeping the amplitude as close as possible to the peak efficiency amplitude increases the average efficiency for lower optical power pixels, as compared to the modulation scheme shown in FIG. 2. In embodiments that operate continuously at lower output values, the modulation scheme shown in FIG. 8 is significantly more efficient than the modulation scheme shown in FIG. 2.

Figure 10:
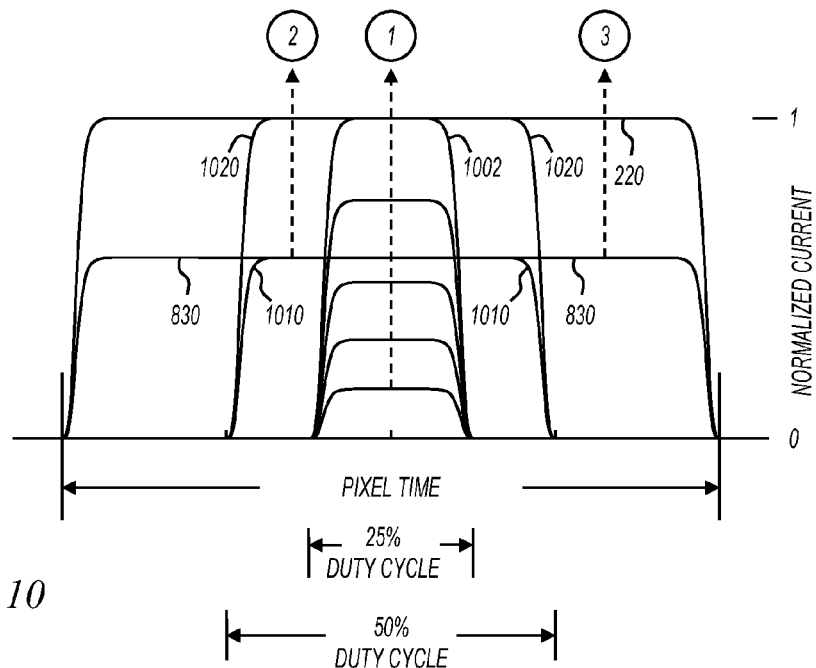
FIG. 10 shows pulse placement within a pixel time in accordance with various embodiments of the present invention.

FIG. 10 shows pulse placement within a pixel time in accordance with various embodiments of the present invention. FIG. 10 shows the same amplitude/duration pairs shown in FIG. 8, with the exception that the pulses are displaced in time. For example, pixel 1002 corresponds to pixel 804, pixel 1010 corresponds to pixel 810, and pixel 1020 corresponds to pixel 820. The only differences are that pixels 804, 810, and 820 are left justified with respect to the pixel time, and pixels 1002, 1010, and 1020 are centered with respect to the pixel time.

Figure 11:
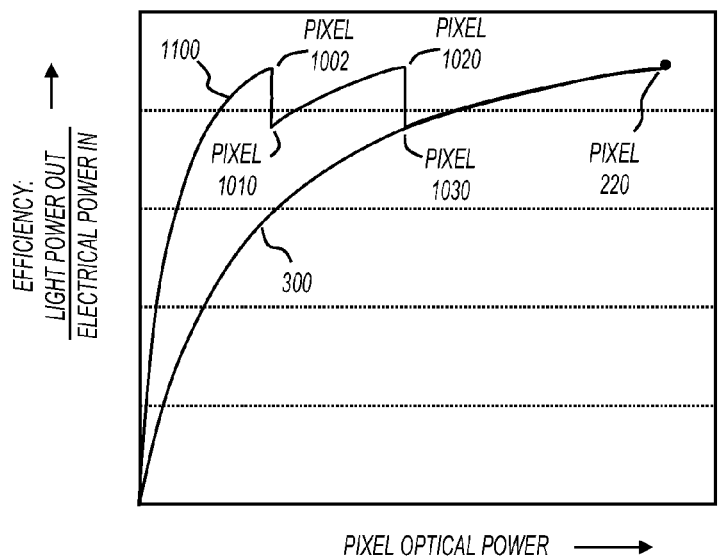
FIG. 11 shows a plot of efficiency as a function of pixel optical power for the waveforms of FIG. 10 in accordance with various embodiments of the present invention.

FIG. 11 shows a plot of efficiency as a function of pixel optical power for the waveforms of FIG. 10 in accordance with various embodiments of the present invention. The efficiencies shown in FIG. 11 are identical to the efficiencies shown in FIG. 9, because the efficiency is not a function of pulse placement in time.

Figure 12:
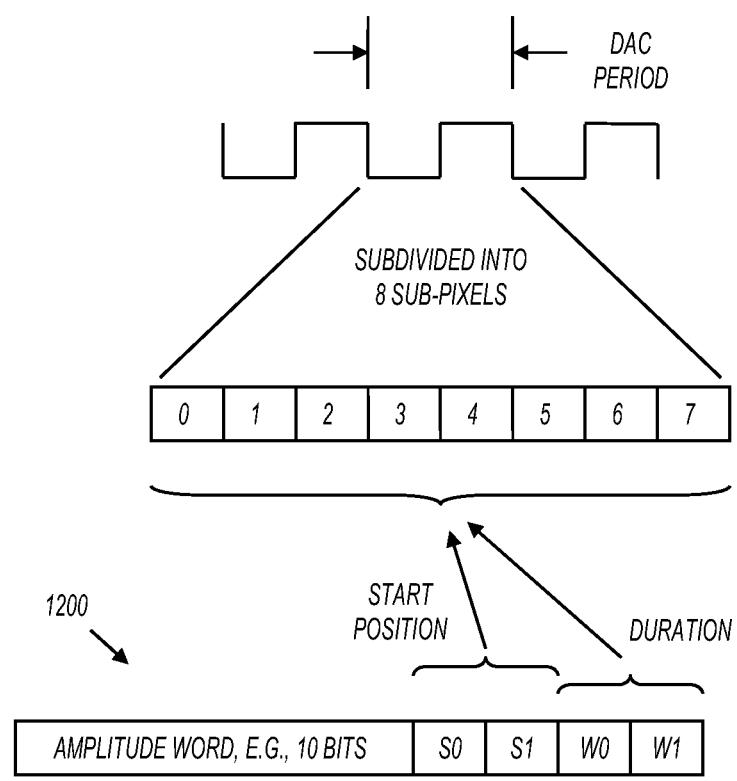
FIGS. 12 and 13 show amplitude and control fields in accordance with various embodiments of the present invention.
Figure 13:
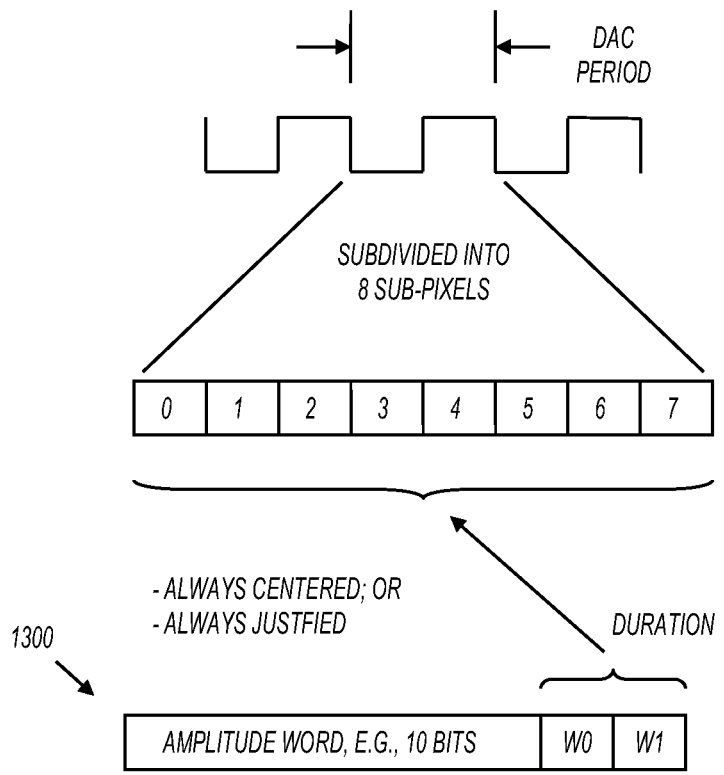

FIGS. 12 and 13 show amplitude and control fields in accordance with various embodiments of the present invention. FIG. 12 shows a DAC clock with a single DAC period subdivided into eight "sub-pixels." FIG. 12 also shows an amplitude word and DAC control 1200 that can be provided to DAC 120 by pixel drive generator 104 to effect the amplitude/duration pairs described above. For example, a ten bit word may specify the amplitude, and the combination of DAC control bits may designate a start a position and a duration. In the example, of FIG. 12, two bits are provided for start position, so one of four possible start locations may be specified. Also for example in FIG. 12, two bits are provided for a duration, so one of four possible durations may be specified. Any number of bits may be used to specify start positions and durations without departing from the scope of the present invention. Further, a DAC period may be subdivided into any number of sub-periods.

FIG. 13 shows an amplitude and control field 1300 that is simpler than that shown in FIG. 12. Amplitude and control field 1300 omits the start position bits. In some embodiments, the resulting duration is always centered in the DAC clock period, and in other embodiments, the resulting duration is always justified (left or right).

Although FIGS. 12 and 13 show a single DAC clock being subdivided, this is not a limitation of the present invention. For example, some pixel times include multiple DAC periods, and the amplitude and control field specifies an amplitude, start, and duration for a plurality of DAC periods when specifying a single pixel. Also for example, in other embodiments, one pixel time occupies fractional DAC periods. In still further embodiments, each pixel time or DAC clock period is subdivided into more or less than 8 sub-pixels. For example, in some embodiments, each DAC clock is subdivided into two or four sub-pixels. Also for example, in some embodiments, each DAC clock is subdivided into 16, 32, or more sub-pixels. The number of DAC control bits may be increased or decreased accordingly.

Figure 14:
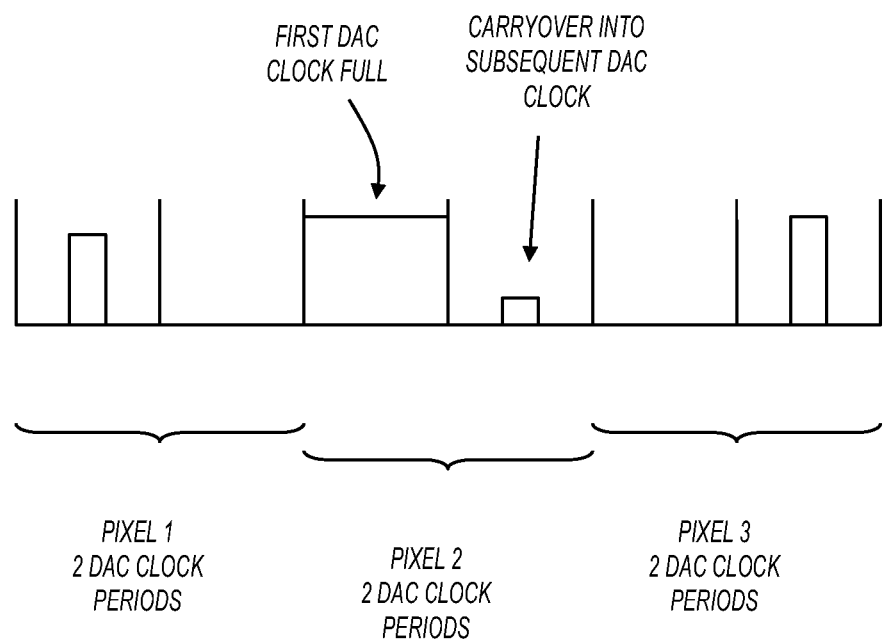
FIG. 14 shows laser drive signal generation with carryover from one DAC clock period to another DAC clock period in accordance with various embodiments of the present invention.

FIG. 14 shows laser drive signal generation with carryover from one DAC clock period to another DAC clock period in accordance with various embodiments of the present invention. FIG. 14 shows three pixel times, each of which occupies two DAC clock periods. Pixel optical light power may be generated within these pixel times in accordance with any of the embodiments described herein. In addition, in some embodiments, the system may be designed such that largest optical power pixels may not be represented in a single DAC clock. In these embodiments, when a DAC clock period is full, the remainder of the optical power is "carried over" to the next DAC clock period. This has the advantage that the voltage on the laser diodes may be reduced, thereby reducing overall power consumption.

Figure 15:
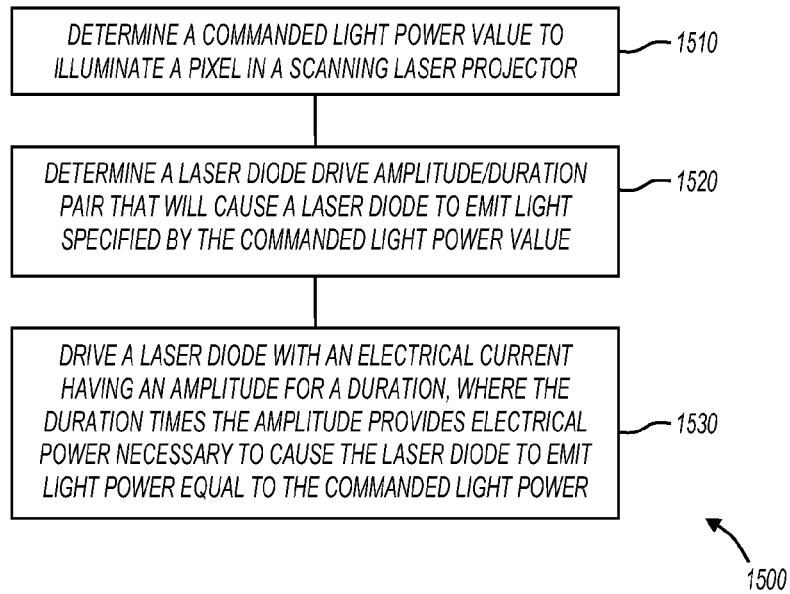
FIGS. 15 and 16 show flowcharts of methods in accordance with various embodiments of the present invention.

FIG. 15 shows a flowchart of methods in accordance with various embodiments of the present invention. In some embodiments, method 1500, or portions thereof, is performed by a scanning projection apparatus, embodiments of which are shown in previous figures. In other embodiments, method 1500 is performed by a series of circuits or an electronic system. Method 1500 is not limited by the particular type of apparatus performing the method. The various actions in method 1500 may be performed in the order presented, or may be performed in a different order. Further, in some embodiments, some actions listed in FIG. 15 are omitted from method 1500.

Method 1500 is shown beginning with block 1510 in which a commanded light power value to illuminate a pixel in a scanning laser projector is determined. In some embodiments, the pixel corresponds to a pixel in a source image, and in other embodiments, the pixel corresponds to a display pixel in the projector's raster pattern, where the display pixel does not correspond one-to-one to a pixel in the source image. Display pixel values may be determined by a video processing component such as component 102 (FIG. 1).

At 1520, an amplitude/duration value pair is determined. The amplitude/duration pair represents a laser diode drive value that will cause a laser diode to emit light specified by the commanded light power value. The amplitude/duration pair may be determined in accordance with any of the embodiments described herein. For example, the amplitude/duration pair may be determined in accordance with the waveforms shown in FIGS. 2, 4, 6, 8, 10, or any combination.

At 1530, a laser diode is driven for the specified duration with an electrical current that has the specified amplitude, where the duration times the amplitude provides the electrical power necessary to cause the laser diode to emit light power equal to the commanded light power.

Figure 16:
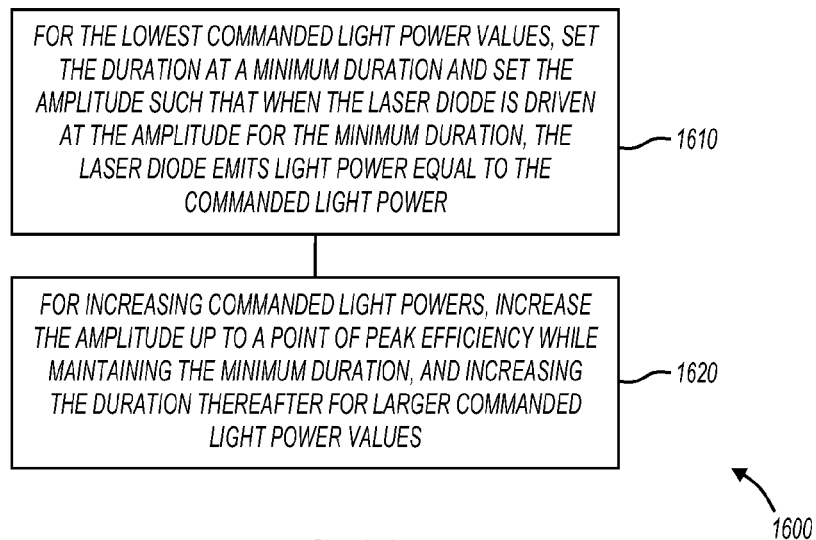

FIG. 16 shows a flowchart of methods in accordance with various embodiments of the present invention. In some embodiments, method 1600, or portions thereof, is performed by a scanning projection apparatus, embodiments of which are shown in previous figures. In other embodiments, method 1600 is performed by a series of circuits or an electronic system. Method 1600 is not limited by the particular type of apparatus performing the method. The various actions in method 1600 may be performed in the order presented, or may be performed in a different order. Further, in some embodiments, some actions listed in FIG. 16 are omitted from method 1600.

Method 1600 provides one example method for determine an amplitude/duration pair. In some embodiments, method 1600 is combined with method 1500 (FIG. 15). Method 1600 is shown beginning with block 1610. For the lowest commanded light power values, the duration is set at a minimum duration and the amplitude is set such that when the laser diode is driven at the amplitude for the minimum duration, the laser diode emits light power equal to the commanded light power. (1610). For increasing commanded light powers, the amplitude is increased up to a point of peak efficiency while maintaining the minimum duration, and increasing the duration thereafter for larger commanded light power values. (1620).

In some embodiments, the amplitude is maintained at the peak efficiency amplitude when the duration is increased. See FIG. 4. In other embodiments, the amplitude is decreased at transition points where the duration is increased. See FIG. 6.

In some embodiments, driving a laser diode comprises driving a digital to analog converter (DAC) driven by a clock (DAC clock), wherein the duration occupies fractional periods of the DAC clock. Further, in some embodiments, the DAC includes return-to-zero (RTZ) functionality, and driving the DAC comprises driving the DAC with control signals to implement RTZ.

Figure 17:
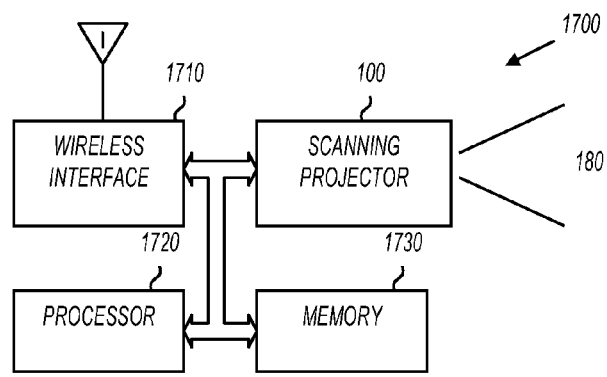
FIG. 17 shows a block diagram of a mobile device in accordance with various embodiments of the present invention.

FIG. 17 shows a block diagram of a mobile device in accordance with various embodiments of the present invention. As shown in FIG. 17, mobile device 1700 includes wireless interface 1710, processor 1720, memory 1730, and scanning projector 10. Scanning projector 100 paints a raster image at image plane 180. Scanning projector 100 includes one or more pixel drive generator components and DACs as described above with reference to previous figures. Scanning projector 10 may be any projection apparatus described herein.

Scanning projector 100 may receive image data from any image source. For example, in some embodiments, scanning projector 100 includes memory that holds still images. In other embodiments, scanning projector 100 includes memory that includes video images. In still further embodiments, scanning projector 100 displays imagery received from external sources such as connectors, wireless interface 1710, a wired interface, or the like.

Wireless interface 1710 may include any wireless transmission and/or reception capabilities. For example, in some embodiments, wireless interface 1710 includes a network interface card (NIC) capable of communicating over a wireless network. Also for example, in some embodiments, wireless interface 1710 may include cellular telephone capabilities. In still further embodiments, wireless interface 1710 may include a global positioning system (GPS) receiver. One skilled in the art will understand that wireless interface 1710 may include any type of wireless communications capability without departing from the scope of the present invention.

Processor 1720 may be any type of processor capable of communicating with the various components in mobile device 1700. For example, processor 1720 may be an embedded processor available from application specific integrated circuit (ASIC) vendors, or may be a commercially available microprocessor. In some embodiments, processor 1720 provides image or video data to scanning projector 100. The image or video data may be retrieved from wireless interface 1710 or may be derived from data retrieved from wireless interface 1710. For example, through processor 1720, scanning projector 100 may display images or video received directly from wireless interface 1710. Also for example, processor 1720 may provide overlays to add to images and/or video received from wireless interface 1710, or may alter stored imagery based on data received from wireless interface 1710 (e.g., modifying a map display in GPS embodiments in which wireless interface 1710 provides location coordinates).

Figure 18:
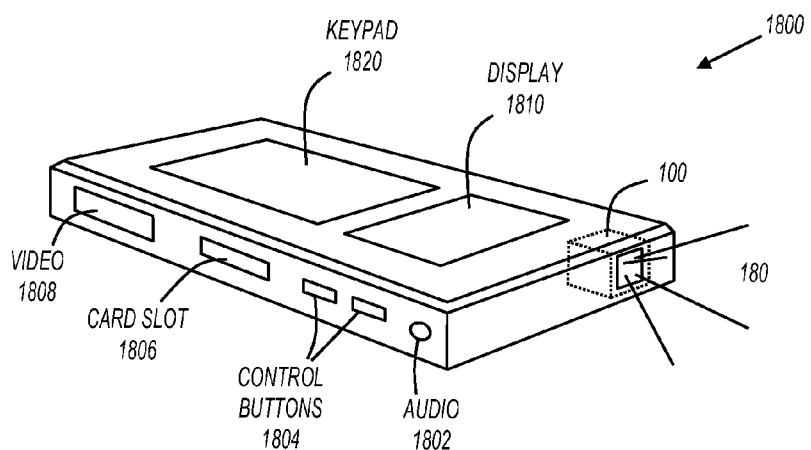
FIG. 18 shows a mobile device in accordance with various embodiments of the present invention.

FIG. 18 shows a mobile device in accordance with various embodiments of the present invention. Mobile device 1800 may be a hand held projection device with or without communications ability. For example, in some embodiments, mobile device 1800 may be a handheld projector with little or no other capabilities. Also for example, in some embodiments, mobile device 1800 may be a device usable for communications, including for example, a cellular phone, a smart phone, a personal digital assistant (PDA), a global positioning system (GPS) receiver, or the like. Further, mobile device 1800 may be connected to a larger network via a wireless (e.g., WiMax) or cellular connection, or this device can accept data messages or video content via an unregulated spectrum (e.g., WiFi) connection.

Mobile device 1800 includes scanning projector 100 to create an image with light at image plane 180. Mobile device 1800 also includes many other types of circuitry; however, they are intentionally omitted from FIG. 18 for clarity.

Mobile device 1800 includes display 1810, keypad 1820, audio port 1802, control buttons 1804, card slot 1806, and audio/video (A/V) port 1808. None of these elements are essential. For example, mobile device 1800 may only include scanning projector 100 without any of display 1810, keypad 1820, audio port 1802, control buttons 1804, card slot 1806, or A/V port 1808. Some embodiments include a subset of these elements. For example, an accessory projector product may include scanning projector 100, control buttons 1804 and A/V port 1808.

Display 1810 may be any type of display. For example, in some embodiments, display 1810 includes a liquid crystal display (LCD) screen. Display 1810 may always display the same content projected at image plane 180 or different content. For example, an accessory projector product may always display the same content, whereas a mobile phone embodiment may project one type of content at image plane 180 while displaying different content on display 1810. Keypad 1820 may be a phone keypad or any other type of keypad.

A/V port 1808 accepts and/or transmits video and/or audio signals. For example, A/V port 1808 may be a digital port that accepts a cable suitable to carry digital audio and video data such as a high definition multimedia interface (HDMI) port. Further, A/V port 1808 may include RCA jacks to accept composite inputs. Still further, A/V port 1808 may include a VGA connector to accept analog video signals. In some embodiments, mobile device 1800 may be tethered to an external signal source through A/V port 1808, and mobile device 1800 may project content accepted through A/V port 1808. In other embodiments, mobile device 1800 may be an originator of content, and A/V port 1808 is used to transmit content to a different device.

Audio port 1802 provides audio signals. For example, in some embodiments, mobile device 1800 is a media player that can store and play audio and video. In these embodiments, the video may be projected at image plane 180 and the audio may be output at audio port 1802. In other embodiments, mobile device 1800 may be an accessory projector that receives audio and video at A/V port 1808. In these embodiments, mobile device 1800 may project the video content at image plane 180, and output the audio content at audio port 1802.

Mobile device 1800 also includes card slot 1806. In some embodiments, a memory card inserted in card slot 1806 may provide a source for audio to be output at audio port 1802 and/or video data to be projected at image plane 180. Card slot 1806 may receive any type of solid state memory device, including for example, Multimedia Memory Cards (MMCs), secure digital (SD) memory cards, and microSD cards. The foregoing list is meant to be exemplary, and not exhaustive.

Figure 19:
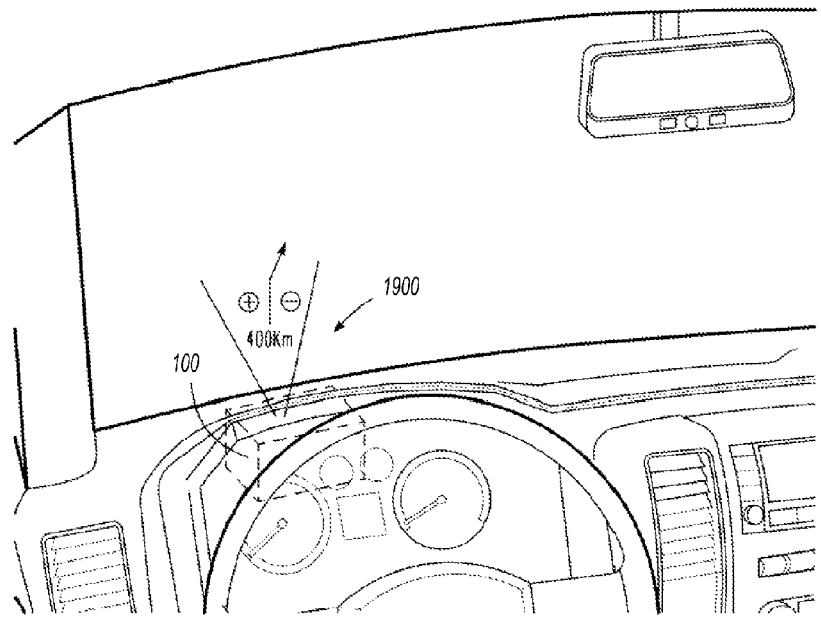
FIG. 19 shows a head-up display system in accordance with various embodiments of the invention.

FIG. 19 shows a head-up display system in accordance with various embodiments of the invention. Projector 100 is shown mounted in a vehicle dash to project the head-up display at 1900. Although an automotive head-up display is shown in FIG. 19, this is not a limitation of the present invention. For example, various embodiments of the invention include head-up displays in avionics application, air traffic control applications, and other applications.

Figure 20:
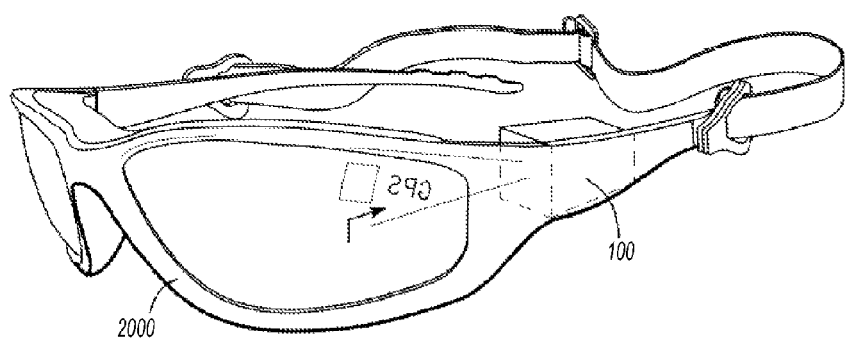
FIG. 20 shows eyewear in accordance with various embodiments of the invention.

FIG. 20 shows eyewear in accordance with various embodiments of the invention. Eyewear 2000 includes projector 100 to project a display in the eyewear's field of view. In some embodiments, eyewear 2000 is see-through and in other embodiments, eyewear 2000 is opaque. For example, eyewear may be used in an augmented reality application in which a wearer can see the display from projector 100 overlaid on the physical world. Also for example, eyewear may be used in a virtual reality application, in which a wearer's entire view is generated by projector 100. Although only one projector 100 is shown in FIG. 20, this is not a limitation of the present invention. For example, in some embodiments, eyewear 2000 includes two projectors; one for each eye.

Figure 21:
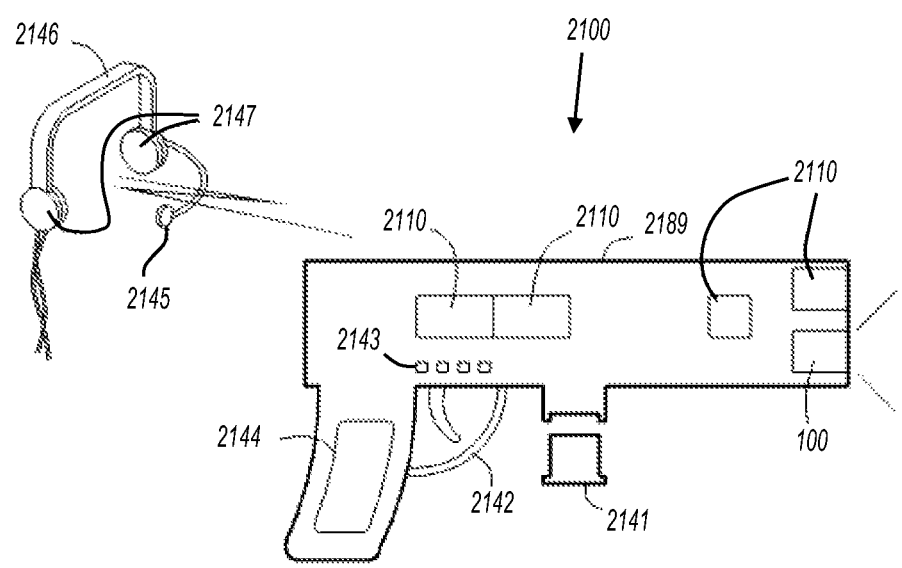
FIG. 21 shows a gaming apparatus in accordance with various embodiments of the present invention.

FIG. 21 shows a gaming apparatus in accordance with various embodiments of the present invention. Gaming apparatus 2100 allows a user or users to observe and interact with a gaming environment. The game is navigated based on the motion, position or orientation of gaming apparatus 2100, an apparatus that includes projection apparatus 100. Other control interfaces, such as manually-operated buttons, foot pedals, or verbal commands, may also contribute to navigation around, or interaction with the gaming environment. For example, in some embodiments, trigger 2142 contributes to the illusion that the user or users are in a first person perspective video game environment, commonly known as a "first person shooter game." Because the projected display can be controlled by the gaming application in combination with the user's movement, gaming apparatus 2100 creates a highly believable or "immersive" environment for these users.

Many other first person perspective simulations can also be created by gaming apparatus 2100, for such activities as 3D seismic geo-prospecting, spacewalk planning, jungle canopy exploration, automobile safety instruction, medical education, etc. Tactile interface 2144 may provide a variety of output signals, such as recoil, vibration, shake, rumble, etc. Tactile interface 2144 may also include a touch-sensitive input feature, such as a touch sensitive display screen or a display screen that requires a stylus. Additional tactile interfaces, for example, input and/or output features for a motion sensitive probe are also included in various embodiments of the present invention.

Gaming apparatus 2100 may also include audio output devices, such as integrated audio speakers, remote speakers, or headphones. These sorts of audio output devices may be connected to gaming apparatus 2100 with wires or through a wireless technology. For example, wireless headphones 1216 provide the user with sound effects via a Bluetooth connection, although any sort of similar wireless technology could be substituted freely. In some embodiments, wireless headphones 2146 may include microphone 2145 or binaural microphone 2147, to allow multiple users, instructors, or observers to communicate. Binaural microphone 2147 typically includes microphones on each ear piece, to capture sounds modified by the user's head shadow. This feature may be used for binaural hearing and sound localization by other simulation participants.

Gaming apparatus 2100 may include any number of sensors 2110 that measure distance, ambient brightness, motion, position, orientation, and the like. For example, gaming apparatus 2100 may detect absolute heading with a digital compass, and detect relative motion with an x-y-z gyroscope or accelerometer. In some embodiments, gaming apparatus 2100 also includes a second accelerometer or gyroscope to detect the relative orientation of the device, or its rapid acceleration or deceleration. In other embodiments, gaming apparatus 2100 may include a Global Positioning Satellite (GPS) sensor, to detect absolute position as the user travels in terrestrial space.

Gaming apparatus 2100 may include battery 2141 and/or diagnostic lights 2143. For example, battery 2141 may be a rechargeable battery, and diagnostic lights 2143 could indicate the current charge of the battery. In another example, battery 2141 may be a removable battery clip, and gaming apparatus 2100 may have an additional battery, electrical capacitor or super-capacitor to allow for continued operation of the apparatus while the discharged battery is replaced with a charged battery. In other embodiments, diagnostic lights 2143 can inform the user or a service technician about the status of the electronic components included within or connected to this device. For example, diagnostic lights 2143 may indicate the strength of a received wireless signal, or the presence or absence of a memory card. Diagnostic lights 2143 could also be replaced by any small screen, such as an organic light emitting diode or liquid crystal display screen. Such lights or screens could be on the exterior surface of gaming apparatus 2100, or below the surface, if the shell for this apparatus is translucent or transparent.

Other components of gaming apparatus 2100 may be removable, detachable or separable from this device. For example, the projection apparatus 100 may be detachable or separable from gaming housing 2149. In some embodiments, the subcomponents of the projection apparatus 100 may be detachable or separable from gaming housing 2149, and still function.

Although the present invention has been described in conjunction with certain embodiments, it is to be understood that modifications and variations may be resorted to without departing from the scope of the invention as those skilled in the art readily understand. Such modifications and variations are considered to be within the scope of the invention and the appended claims.

What is claimed is:

1. A scanning laser projector comprising:
   a laser light source to create display pixels by modulating light;
   a scanning mirror to reflect the light from the laser light source in a raster pattern to display an image;
   a laser driver circuit to receive digital drive values representing an amplitude and a duration for each pixel to be displayed, and to drive the laser light source with an electrical current having the amplitude for the duration for each pixel to be displayed; and
   a pixel value generator to receive commanded light power values and to generate the digital drive values, wherein, as commanded light power values increase, the pixel value generator increases the amplitude without increasing the duration until a peak efficiency amplitude is reached.

2. The scanning laser projector of claim 1 wherein the duration is expressed as a percent duty cycle and the duration is increased at a transition point defined as the commanded light power value at which the commanded light power value equals the peak efficiency amplitude times the percent duty cycle.

3. The scanning laser projector of claim 2 wherein the duration is increased and the amplitude is decreased when commanded light power exceeds the transition point.

4. The scanning laser projector of claim 2 wherein the amplitude remains constant and the duration is incrementally increased when commanded light power exceeds the transition point.

5. The scanning laser projector of claim 2 wherein two transition points are defined corresponding to duty cycles of 25% and 50%.

6. The scanning laser projector of claim 1 wherein the laser driver circuit comprises a digital to analog converter (DAC) driven by a clock (DAC clock), and wherein the duration occupies fractional periods of the DAC clock.

7. The scanning laser projector of claim 6 wherein the DAC includes return-to-zero (RTZ) functionality, and the pixel value generator drives the DAC with control signals to implement RTZ.

8. The scanning laser projector of claim 6 wherein the DAC clock comprises a fixed frequency clock.

9. The scanning laser projector of claim 6 wherein the DAC clock comprises a variable frequency clock.

10. A method comprising:
   determining a commanded light power value to illuminate a pixel in a scanning laser projector; and
   driving a laser diode with an electrical current having an amplitude for a duration, where the amplitude times the duration provides electrical power necessary to cause the laser diode to emit light power equal to the commanded light power;
   wherein the amplitude and duration are chosen for each pixel as follows:
   for the lowest commanded light power values, setting the duration at a minimum duration and setting the amplitude such that when the laser diode is driven at the amplitude for the minimum duration, the laser diode emits light power equal to the commanded light power; and
   for increasing commanded light power values, increasing the amplitude up to a point of peak efficiency while maintaining the minimum duration, and increasing the duration thereafter for larger commanded light power values.

11. The method of claim 10 wherein increasing the duration comprises increasing the duration in discrete increments.

12. The method of claim 11 further comprising keeping the amplitude at the peak efficiency amplitude while increasing the duration.

13. The method of claim 11 further comprising reducing the amplitude when increasing the duration.

14. The method of claim 10 wherein driving a laser diode comprises driving a digital to analog converter (DAC) driven by a clock (DAC clock), and wherein the duration occupies fractional periods of the DAC clock.

15. The method of claim 14 wherein the DAC includes return-to-zero (RTZ) functionality, and driving the DAC comprises driving the DAC with control signals to implement RTZ.

16. The method of claim 14 wherein the DAC clock comprises a fixed frequency clock.

17. The method of claim 14 wherein the DAC clock comprises a variable frequency clock.

18. A mobile device comprising:
   a radio capable of receiving video information; and
   a scanning laser projector to display the video information, the scanning laser projector including:
      a laser light source to create display pixels by modulating light;
      a scanning mirror to reflect the light from the laser light source in a raster pattern to display an image;
      a laser driver circuit to receive digital drive values representing an amplitude and a duration for each pixel to be displayed, and to drive the laser light source with an electrical current having the amplitude for the duration for each pixel to be displayed; and
      a pixel value generator to receive commanded light power values and to generate the digital drive values, wherein, as commanded light power values increase, the pixel value generator increases the amplitude without increasing the duration until a peak efficiency amplitude is reached.

19. The mobile device of claim 18 wherein the mobile device comprises a mobile phone.

20. The mobile device of claim 18 wherein the mobile device comprises a gaming device.

* * * * *